US008120426B1

(12) United States Patent
Granger-Jones et al.

(10) Patent No.: US 8,120,426 B1
(45) Date of Patent: Feb. 21, 2012

(54) LOW NOISE CLASS AB LINEARIZED TRANSCONDUCTOR

(75) Inventors: Marcus Granger-Jones, Scotts Valley, CA (US); Jim Connelly, Midleton (IE)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 12/820,807

(22) Filed: Jun. 22, 2010

Related U.S. Application Data

(60) Provisional application No. 61/219,207, filed on Jun. 22, 2009.

(51) Int. Cl.
*H03F 3/45* (2006.01)
(52) U.S. Cl. .......................................... 330/260; 330/253
(58) Field of Classification Search .................. 330/253, 330/255, 260
See application file for complete search history.

(56) References Cited

U.S. PATENT DOCUMENTS 7,482,871 B2 * 1/2009 Lee et al. ....................... 330/260
7,898,333 B2 * 3/2011 Griffith et al. ................ 330/260

OTHER PUBLICATIONS

Alzaher, H. et al., "A CMOS fully balanced four-terminal floating nullor," IEEE Transactions on Circuits and Systems I: Fundamental Theory and Applications, Apr. 2002, pp. 413-424, vol. 49, No. 4, IEEE.
Bult, K et al., "A class of analog CMOS circuits based on the square-law characteristic of an MOS transistor in saturation," IEEE Journal of Solid-State Circuits, Jun. 1987, pp. 357-365, vol. 22, No. 3, IEEE.
Jones, C. et al., "Direct-Conversion WCDMA Transmitter with −163dBc/Hz Noise at 190MHz Offset," Digest of Technical Papers, 2007 International IEEE Solid-State Circuits Conference, Feb. 11-15, 2007, pp. 336-607, IEEE.
Kallam, P. et al., "An improved Q-tuning scheme and a fully symmetric OTA," 2002 IEEE International Symposium on Circuits and Systems, 2002, pp. V-165 to V-168, vol. 5, IEEE.
Nabicht, J.T. et al., "A programmable 1.8-18 MHz high-Q fully-differential continuous-time filter with 1.5-2 V power-supply," 1994 IEEE International Symposium on Circuits and Systems, May 30-Jun. 2, 1994, pp. 653-656, vol. 5, IEEE.
Carlin, H., "Singular Network Elements," IEEE Transactions on Circuit Theory, Mar. 1964, pp. 67-72, vol. 11, No. 1, IEEE.

* cited by examiner

*Primary Examiner* — Khanh Nguyen
(74) *Attorney, Agent, or Firm* — Withrow & Terranova, P.L.L.C.

(57) ABSTRACT

A transconductor stage is a linearized class AB amplifier having embedded noise filtering that enables a biasing of an in-phase/quadrature (I/Q) modulator core with a low quiescent current. Linearization of the transconductor stage is increased by introducing a small amount of negative feedback into the transconductor stage via a feedback circuitry and an error amplifier. A dominant open loop pole in a path between the error amplifier and an output stage of the transconductor stage forms a dominant pole low-pass filter. A low-pass filter transfer function created when a loop including the feedback circuitry is closed attenuates noise introduced by baseband circuitry that supplies baseband signals to the transconductor stage. A master output stage biases a plurality of slave output stages that are in parallel with the master output stage. Each slave output stage is coupled to an individual modulator core such as a Gilbert cell mixer core.

20 Claims, 6 Drawing Sheets

LOW NOISE CLASS AB LINEARIZED TRANSCONDUCTOR

RELATED APPLICATIONS

This application claims the benefit of provisional patent application Ser. No. 61/219,207, filed Jun. 22, 2009, the disclosure of which is hereby incorporated herein by reference in its entirety.

FIELD OF THE DISCLOSURE

The present disclosure relates to baseband transconductor stages, and in particular to a low noise class AB transconductor stage that is linearized.

BACKGROUND

Balanced modulators such as Gilbert cell mixers are adversely affected by electronic noise. In particular, in-phase/quadrature (I/Q) modulator designs based on Gilbert cell mixers have degraded performance when exposed to electronic noise that may generate spurious signals outside a desired frequency band. A significant source of this out of band electronic noise is shot noise that is proportional in magnitude to a direct current (DC) supplying the I/Q modulator with power. The shot noise of most concern is typically generated in the I/Q modulator's commutating transistors and baseband transconductor stage.

Prior art I/Q modulator designs based on Gilbert cell mixers typically use a class A transconductor stage. Examples of such transconductor stages include a degenerated differential transistor pair amplifier and a linearized feedback amplifier with a class A current mode output stage. However, the use of a class A transconductor stage as part of an I/Q modulator is problematic from a shot noise perspective because a DC current supplying the class A transconductor stage is dictated by a worst-case peak current requirement. In this case, the worst-case peak current requirement is a function of the worst-case peak-to-average-ratio (PAR) for current rather than being a function of an adjacent channel leakage ratio (ACLR) or other noise consideration. In particular, the DC current supplying the class A transconductor stage must be sufficient to allow a maximum PAR demanded by modulating baseband signals inputted into the class A transconductor stage. For example, if the instantaneous signal current required from the class A transconductor stage exceeds the available DC current, the class A transconductor stage will suddenly deliver a nonlinear output that will cause spectral splatter along with a relatively rapid degradation in ACLR.

Moreover, with telecommunication modes such as Wideband Code Division Multiple Access (WCDMA), High-Speed Uplink Packet Access (HSUPA), and Code Division Multiple Access (CDMA), PAR is not well defined and may vary between a range of 3 dB and 11 dB depending on the number of control and data channels being transmitted. Thus, the direct current supplying the class A transconductor stage is dictated by the worst-case peak current requirement, which in this case is 11 dB. Therefore, a relatively high quiescent current is set for the overall I/Q modulator design. As a result of this relatively high quiescent current, undesirable shot noise is generated together with a waste of power. Accordingly, there remains a need for a low noise linearized and efficient transconductor stage that is usable with active I/Q modulator designs based on Gilbert cell mixers.

SUMMARY

The present disclosure provides a low noise linearized and efficient transconductor stage that is usable with active I/Q modulator designs based on Gilbert cell mixers. In fact, the disclosed transconductor stage may be considered a key enabling technology for a quadrature modulator that requires an extremely low out of band noise.

In general, the disclosed transconductor stage is a linearized class AB amplifier having embedded noise filtering that enables a biasing of an I/Q modulator core with a relatively low quiescent current. In comparison with baseband signal currents, the relatively low quiescent current results in a reduction of undesirable shot noise while at the same time increasing the efficiency of the transconductor stage.

In an embodiment of the present disclosure, linearization of the transconductor stage is increased by introducing a small amount of negative feedback into the transconductor stage via a feedback circuitry and an error amplifier. A dominant open loop pole in a path between the error amplifier and an output stage of the transconductor stage forms a dominant pole low-pass filter that is embedded in the transconductor stage. The dominant open loop pole of the dominant pole low-pass filter is set to a relatively low frequency to attenuate noise outputted by the error amplifier. A low-pass filter transfer function created when a loop including the feedback circuitry is closed attenuates wideband noise introduced by baseband circuitry that supplies baseband signals to the transconductor stage.

The output stage is a common source (CS) amplifier stage that is biased with a constant common-mode gate-to-source voltage ($V_{gs}$). Biasing the output stage with a constant common-mode $V_{gs}$ insures that the output stage has a desirable adjacent channel leakage ratio (ACLR) for the output stage's particular direct current (DC) demand. Preferably, the output stage is made up of field effect transistors (FETs) that follow a square law characteristic when operated in a saturated region. Electron mobility roll off due to vertical and lateral fields in a FET tend to cause deviations from the square law. Therefore, long channel devices, p-channel field-effect transistors (pFETs) and devices with thick gate oxide tend to follow the square law more closely than devices such as deep sub-micron FETs. A practical design of device geometry for transistors that are usable for the output stage is determined via device simulation. Bias point optimization is also determined via device simulation.

It is important to note that the use of common-mode $V_{gs}$ biasing combined with the FETs of the output stage following the square law results in the output stage being inherently linear. The inherent linear nature of the output stage allows for the use of only a small amount of feedback, which in turn allows for the embedding of the dominant pole filter directly into the transconductor stage.

The output stage of the transconductor stage may also be considered a master output stage for a plurality of slave output stages that are in parallel with the master output stage. Each of the slave output stages is coupled to an individual modulator core such as a Gilbert cell mixer core. The plurality of slave output stages may be individually switched on and off via a switch controller to provide a stepped gain control. Significant current savings can be realized as output power of the transconductor stage is reduced by switching off individual ones of the plurality of slave output stages, which in turn switch off corresponding modulator cores. The master output stage and the plurality of slave output stages are biased to operate as class AB amplifiers.

Further still, a fine stepped gain control may be implemented through the use of an optional resistive digital step attenuator placed between the baseband circuitry and the error amplifier. An optional single pole low-pass filter may also be added between the baseband circuitry and the error amplifier in order to further attenuate electronic noise that may be introduced by the baseband circuitry and the optional resistive digital step attenuator.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
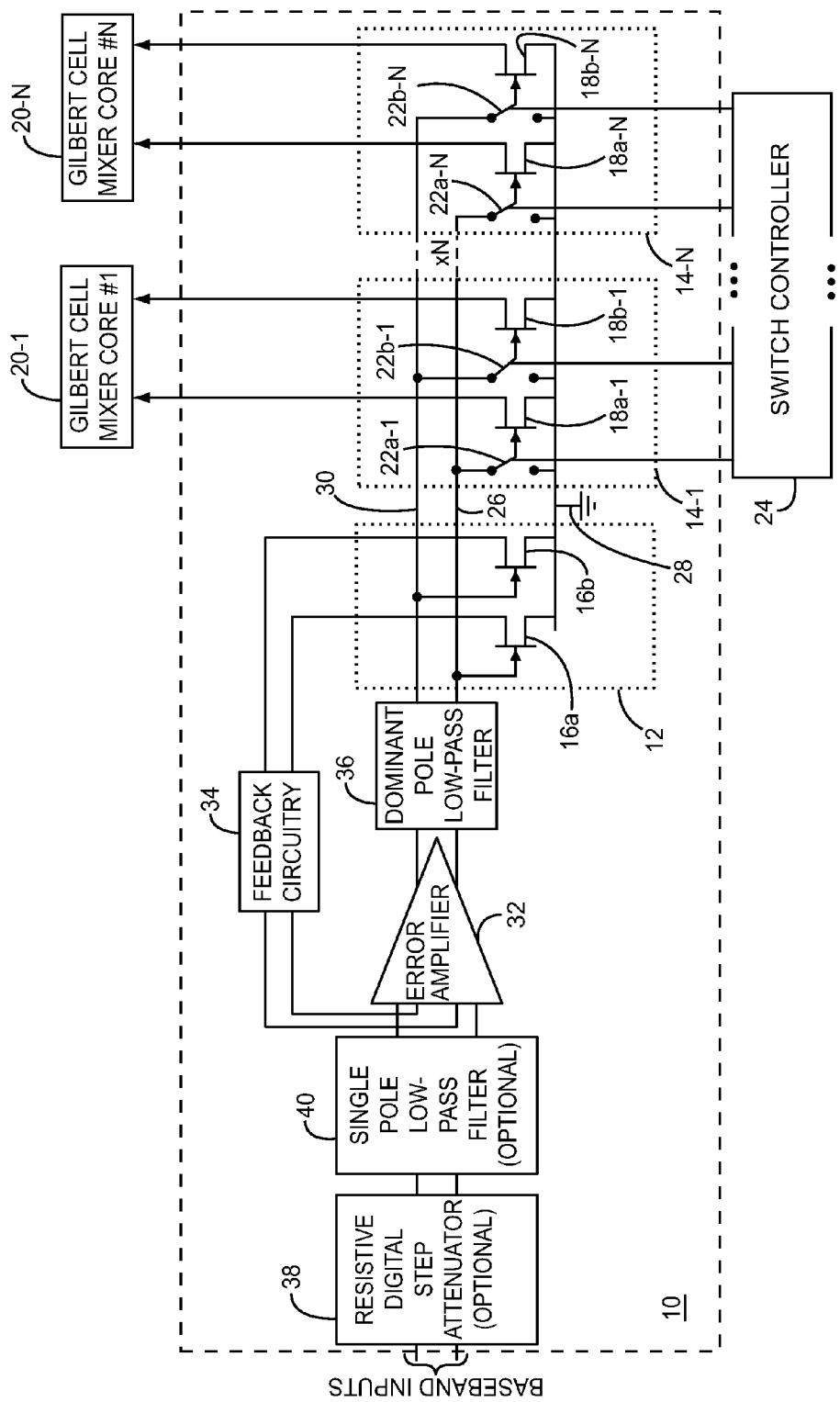
FIG. 1 is a block diagram of a transconductor stage that is in accordance with the present disclosure.

FIG. 1 is a block diagram of a transconductor stage 10 that is in accordance with the present disclosure. The transconductor stage 10 includes a master output stage 12 that is operated as a class AB amplifier. The master output stage 12 acts as a master transconductor stage for an N number of parallel slave output stages 14-1 through 14-N. The master output stage 12 is a pseudo differential common source (CS) complementary metal-oxide-semiconductor (CMOS) amplifier that includes a first transistor 16a and a second transistor 16b. Similarly, the slave output stage 14-1 is a pseudo differential CS CMOS amplifier, which includes a first transistor 18a-1 and a second transistor 18b-1 that both drive a Gilbert cell mixer core 20-1. Likewise, the slave output stage 14-N is a pseudo differential CS CMOS amplifier, which includes a first transistor 18a-N and a second transistor 18b-N that both drive a Gilbert cell mixer core 20-N.

The slave output stage 14-1 further includes a first switch 22a-1 for switching the first transistor 18a-1 on and off and a second switch 22b-1 for switching the second transistor 18b-1 on and off. Similarly, the slave output stage 14-N includes a first switch 22a-N for switching the first transistor 18a-N on and off, and a second switch 22b-N for switching the second transistor 18b-N on and off. A switch controller 24 provides switch control signals for independently switching first switches 22a-1 and 22a-N between a first output node 26 and a ground node 28. In a similar manner, the switch controller 24 provides switch control signals for independently switching second switches 22b-1 and 22b-N between a second output node 30 and the ground node 28.

The master output stage 12 and the slave output stages 14-1 through 14-N exhibit class AB amplifier behavior when powering up under large signal conditions. Electrical and physical characteristics as well as operating bias and technology choice for implementing the master output stage 12, and the slave output stages 14-1 through 14-N are chosen such that class AB amplifier operation with low third order intermodulation distortion at desirable output powers is realized. Moreover, second order distortion products will cancel when differential signals outputted from the transconductor stage 10 are recombined in an output balun/autotransformer (not shown). The first and second transistors 16a, 16b and the first and second transistors 18a-1 through 18b-N can be implemented using n-channel field-effect transistors (nFETs) or p-channel field-effect transistors (pFETs). The choice between implementation using nFETs or pFETs is primarily determined by the technology used to implement the Gilbert cell mixer cores 20-1 through 20-N. For example, by using pFETs, the transconductor stage will tend to be more linear. However, the use of pFETs may yield poorer performance in the Gilbert cell mixer cores 20-1 through 20-N.

An error amplifier 32 and a feedback circuitry 34 introduce a small amount of negative feedback into the master output stage 12 in order to linearize class AB operation of the transconductor stage 10. The error amplifier 32 and the feedback circuitry 34 provide just enough linearity using negative feedback such that ACLR requirements are just met. Designing the transconductor stage 10 to have more linearity than that needed to meet ACLR requirements will likely result in too much direct current (DC) draw by the transconductor stage 10, which in turn will increase undesirable shot noise while also wasting energy.

A dominant open loop pole in a path between the error amplifier 32 and the master output stage 12 forms a dominant pole low-pass filter 36 that is embedded in the transconductor stage 10. The dominant open loop pole of the dominant pole low-pass filter 36 is set to a relatively low frequency to attenuate noise outputted by the error amplifier 32. A low-pass filter transfer function created when a feedback loop including the feedback circuitry 34 is closed attenuates wideband noise introduced by baseband circuitry (not shown) that supplies baseband signals to the baseband inputs of the transconductor stage 10.

A precision fine stepped gain control may be implemented through the use of a resistive digital step attenuator 38 placed between the baseband circuitry and the error amplifier 32. The resistive digital step attenuator 38 is optional and its details are discussed in detail below. A single pole low-pass filter 40 that is optional may also be added between the baseband circuitry and the error amplifier 32 in order to further attenuate electronic noise that may be introduced by the baseband circuitry.

Figure 2:
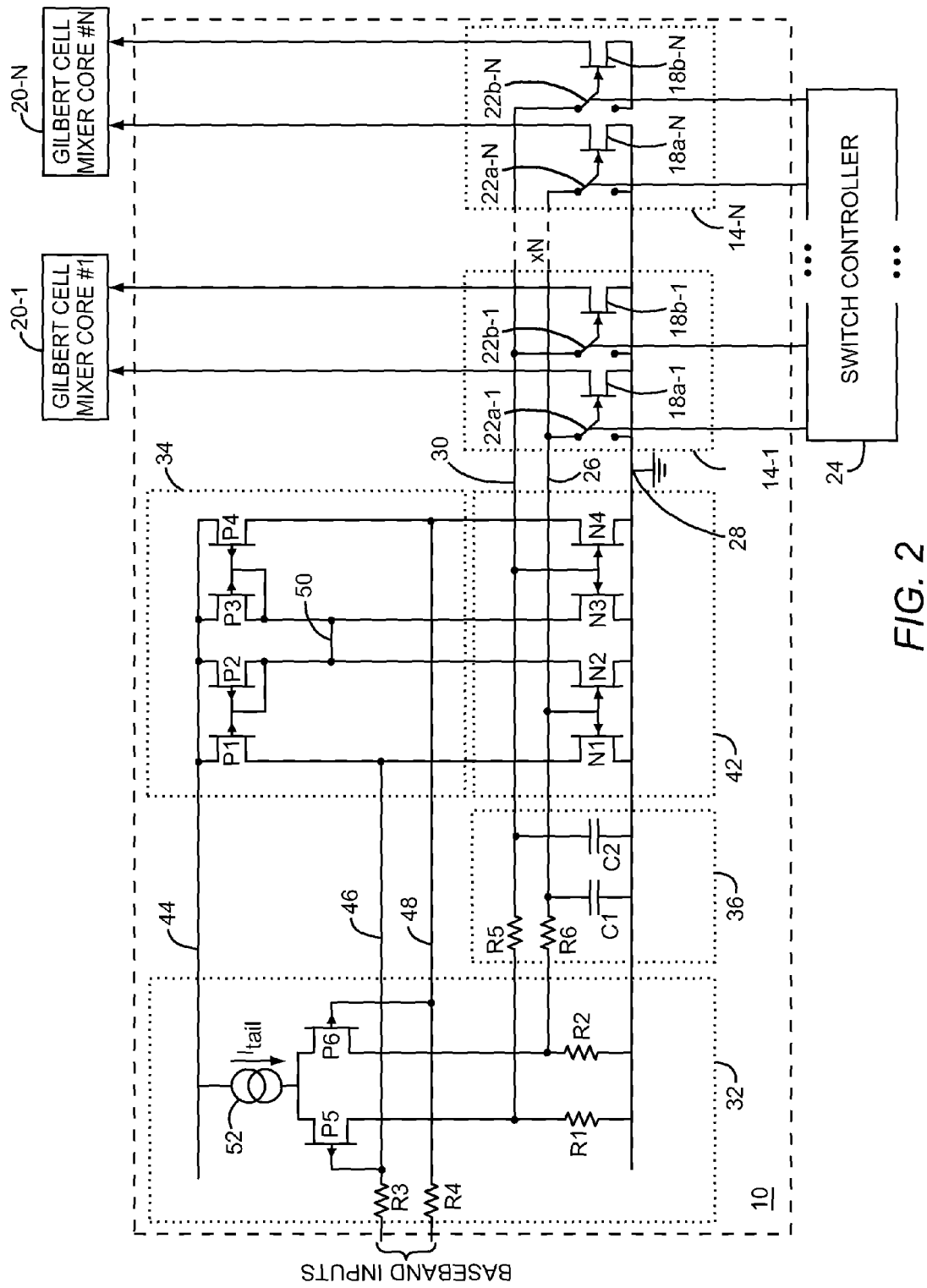
FIG. 2 is a circuit schematic that provides an alternate embodiment of the master output stage along with details of the feedback circuitry, the error amplifier, and the dominant pole filter.

FIG. 2 is a circuit schematic that provides an alternate embodiment of the master output stage 12 along with details of the feedback circuitry 34, error amplifier 32, and dominant pole low-pass filter 36. An alternate master output stage 42 that is adapted for class AB operation is made up of a transistor N1, a transistor N2, a transistor N3, and a transistor N4.

In particular, the gates of the transistor N1 and the transistor N2 are coupled to the first output node 26, and the sources of the transistor N1 and the transistor N2 are coupled to the ground node 28. The gates of the transistor N3 and the transistor N4 are coupled to the second output node 30, while the sources of the transistor N3 and the transistor N4 are coupled to the ground node 28. The channel dimensions and the common-mode gate-to-source voltage ($V_{gs}$) biases for the transistors N1, N2, N3, and N4 are preferably substantially identical. Moreover, it is also preferred that the first and second transistors 18a-1 through 18b-N of the slave output stages 14-1 through 14-N are FET transistors that have channel dimensions and $V_{gs}$ biases that are substantially identical to those of transistors N1 through N4 of alternate master output stage 42.

The feedback circuitry 34 can be considered as a pseudo differential transconductor stage having high output impedance. A transistor P1, a transistor P2, a transistor P3, and a transistor P4 making up the feedback circuitry 34 have sources coupled to a power source node 44. The drain of the transistor P1 is coupled to the drain of the transistor N1 of the master output stage 42. Also, the drain of the transistor P2 is coupled to the drain of the transistor N2. Similarly, the drain of the transistor P3 is coupled to the drain of the transistor N3. In like fashion, the drain of the transistor P4 is coupled to the drain of the transistor N4. The gates of the transistor P1 and the transistor P2 are coupled to the drains of the transistor P2 and the transistor N2 to make a first current mirror configuration. Similarly, the gates of the transistor P3 and the transistor P4 are coupled to the drains of the transistor P3 and the transistor N3 to make a second current mirror configuration.

The first and second current mirror configurations are adapted to provide current at a rate equal to a power up rate for the transistor N1 and the transistor N4 that make up a master CS amplifier. The provided current is usable as a pull-up current that is equal to DC currents flowing through the transistors N1 and N4. In this way, the feedback circuitry 34 is adapted to maintain a common-mode gate-to-source voltage ($V_{gs}$) at a pair of feedback nodes 46 and 48 for the error amplifier 32. The drains of the transistors P1 and N1 are coupled to the feedback node 46, and the drains of the transistors P4 and N4 are coupled to the output node 48. It should be noted that the provided DC current can increase by as much as a factor of five under large signal conditions that may exist with the application of large amplitude baseband signals. For example, operational simulations of the transconductor stage 10 with a quiescent DC current of less than 5 milli-Amperes (mA) have shown that linearity during class AB operation is maintained even during peak currents of up to 27 mA.

The drains of the transistors P2, P3, N2, and N3 may be coupled together at a coupling node 50 to reduce the loop gain of the feedback circuitry 34 by a factor of two. As a result of implementing the coupling node 50 very wideband noise within the transconductor stage 10 is reduced. Moreover, the coupling node 50 is preferred because it configures the transistors N2 and N3 such that the noise passed by the transistors N2, N3, P2, and P3 appears as common noise that is rejected by the error amplifier 32.

The error amplifier 32 can reject common noise due to a differential configuration of a transistor P5 and a transistor P6. The gate of the transistor P5 is coupled to the feedback node 46 and the gate of the transistor P6 is coupled to the feedback node 48. The sources of the transistor P5 and the transistor P6 are coupled together at an output of a current source 52 that has an input coupled to the power source node 44. The current source 52 provides a tail current ($I_{tail}$) that flows through the transistor P5 and the transistor P6. A resistor R1 has a first terminal coupled to the drain of the transistor P5 and a second terminal coupled to the ground node 28. Another resistor R2 has a first terminal coupled to the drain of the transistor P6 and a second terminal coupled to the ground node 28. A resistor R3 has a first terminal available for input of a baseband signal and a second terminal coupled to the gate of the transistor P5 and the feedback node 46. A resistor R4 has a first terminal available for input of a baseband signal and a second terminal coupled to the gate of the transistor P6 and the feedback node 48. If the coupling node 50 is not implemented, the feedback loop gain will increase by a factor of two. This increase in feedback loop gain can be compensated for by reducing the nominal resistance values of the resistors R3 and R4 by a factor of two.

The dominant pole low-pass filter 36 is made up of a resistor R5, a resistor R6, a capacitor C1, and a capacitor C2. The resistor R5 has a first terminal coupled to the drain of the transistor P5 and a second terminal coupled to the second output node 30. A first terminal of the capacitor C2 is also coupled to the second output node 30, and a second terminal of the capacitor C2 is coupled to the ground node 28. The resistor R6 has a first terminal coupled to the drain of the transistor P6 and a second terminal coupled to the first output node 26. A first terminal of the capacitor C1 is also coupled to the first output node 26, and a second terminal of the capacitor C1 is coupled to the ground node 28.

The dominant pole of the dominant pole low-pass filter 36 is defined by the resistors R1 and R5 combined with the capacitor C2, and the resistors R2 and R6 combined with the capacitor C1. The dominant pole provides noise filtering for noise generated by baseband circuitry (not shown), the feedback circuitry 34, and the error amplifier 32. The dominant pole also provides stabilization for the feedback loop providing the linearization for the transconductor stage 10. The dominant pole can optionally be tuned by using adjustable versions of the resistors R5 and R6 and/or the capacitors C1 and C2.

When the feedback loop for the transconductor stage is targeted for Wideband Code Division Multiple Access (WCDMA) a very low loop gain of around 10 db is preferred. A dominant pole of around 3 MHz is also preferred along with a closed loop bandwidth of around 10 MHz. The resulting configuration for the dominant pole low-pass filter 36 provides a closed feedback loop with a 3 dB bandwidth centered around 10 MHz. The 10 MHz closed loop bandwidth allows for additional poles to be introduced into the dominant pole low-pass filter 36 in order to attenuate wideband noise without compromising stability. For example, wideband noise within a 45 MHz offset from the bandwidth center can achieved via additional poles. Moreover, adding capacitors in parallel with the resistor R3 and the resistor R5 allows for the roll off of even higher frequency noise.

Figure 3:
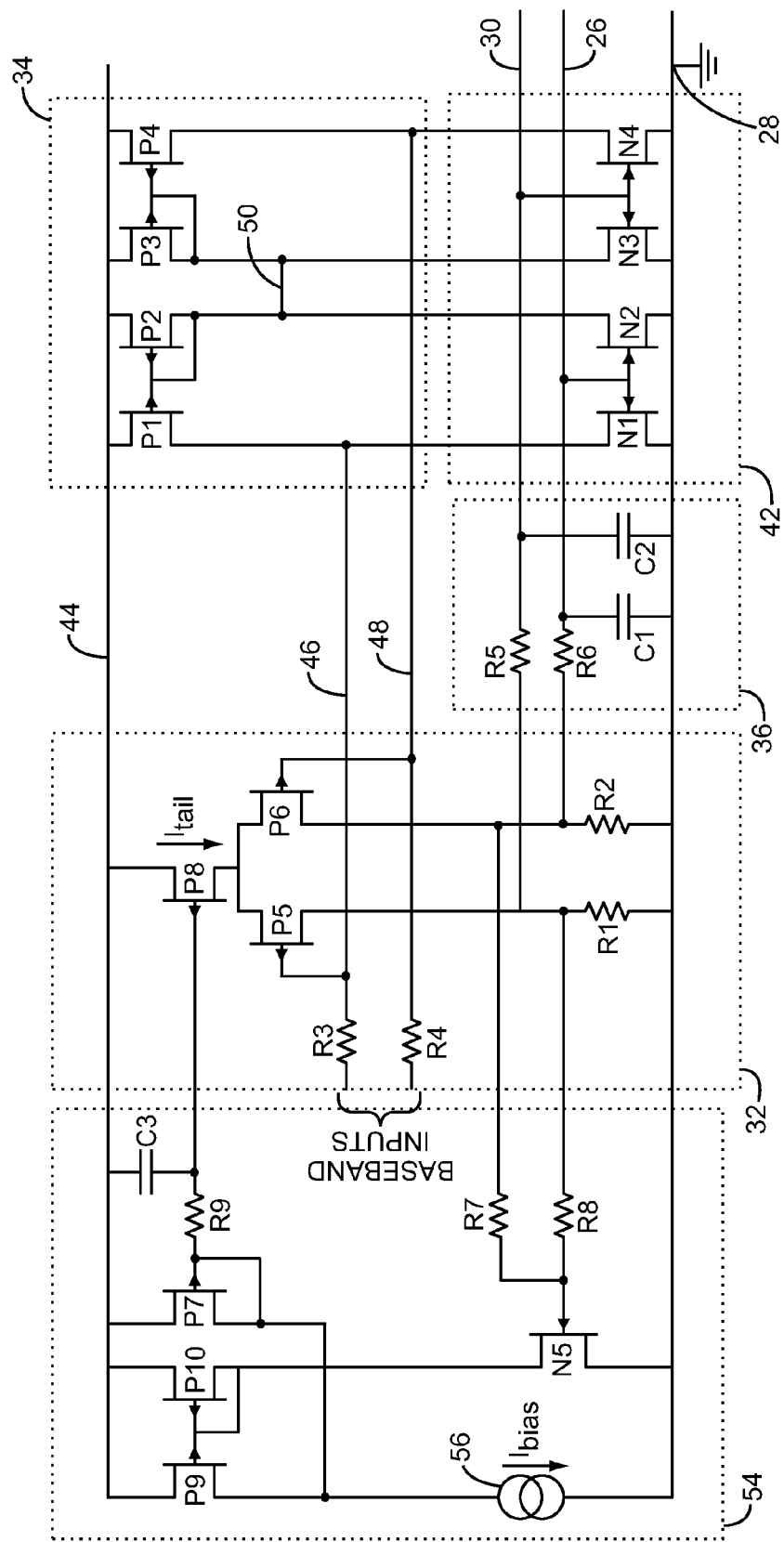
FIG. 3 is a circuit schematic depicting a bias generation circuitry that is adapted to provide a bias current to the transconductor stage.

Turning now to FIG. 3, a bias generation circuitry 54 is added to the transconductor stage 10. The quiescent DC current for the transconductor stage 10 is set by the $V_{gs}$ voltages of the transistor N1 and the transistor N4 that are defined by the $I_{tail}$ current and the resistors R1 and R2.

The $V_{gs}$ voltages are sensed through high resistance value resistors. The bias generation circuitry 54 includes a resistor R7 and a resistor R8 that are usable to sense the $V_{gs}$ voltages of the transistors N1 and N4. The resistor R7 has a first terminal coupled to the gate of a transistor N5. The resistor R7 has a second terminal coupled to drain of the transistor P6, which is coupled to the first terminals of the resistors R2 and R6. The resistor R8 has a first terminal coupled to the gate of the transistor N5 and a second terminal coupled to the drain of the transistor P5, which is coupled to the first terminals of the resistors R1 and R5. The source of the transistor N5 is coupled to the ground node 28.

The gate of a transistor P7 is coupled to a first terminal of a resistor R9 that has a second terminal coupled to the gate of a transistor P8 that is usable as the current source 52 (FIG. 2) that sources the $I_{tail}$ current. It is preferred that the $I_{tail}$ current be inversely proportional to the threshold voltages (i.e., $V_{gs}$ voltages) of the transistors N1 and N4 in order to make the $I_{tail}$ current insensitive to threshold characteristic variations over temperature and manufacturing process deviations. The $I_{tail}$ current can be made inversely proportional to the $V_{gs}$ voltages of the transistors N1 and N4 through pre-distortion in the bias generation circuitry 54 that provides a common mode feedback loop.

A current source 56 is biased by the transistor P7 and a transistor P9 that both have source terminals coupled to the power source node 44. The drains of both the transistor P7 and the transistor P9 are coupled to the current source 56. The drain of the transistor N5 is coupled to the drain of a transistor P10. The transistors N5 and P10 provide a current that is representative of the sensed $V_{gs}$ voltages. The current provided by the transistors N5 and P10 is a negative current input of a current mode feedback loop that in turn urges the feedback current to be substantially equal to a reference current $I_{bias}$, which is maintained by the current source 56.

A capacitor C3 having a first terminal coupled to the power source node 44 has a second terminal coupled to the second terminal of resistor R9. The combination of the resistor R9 and the capacitor C3 forms a noise filter for the bias generation circuitry 54. The gate of the transistor P9 is coupled to the gate and drain of the transistor P10.

Generally, the current mode feedback loop is low gain because absolute accuracy is not needed for balancing the feedback current to the reference current $I_{bias}$. Moreover, the low loop gain is easier to stabilize, especially since there may be multiple poles in the current mode feedback loop.

Figure 4:
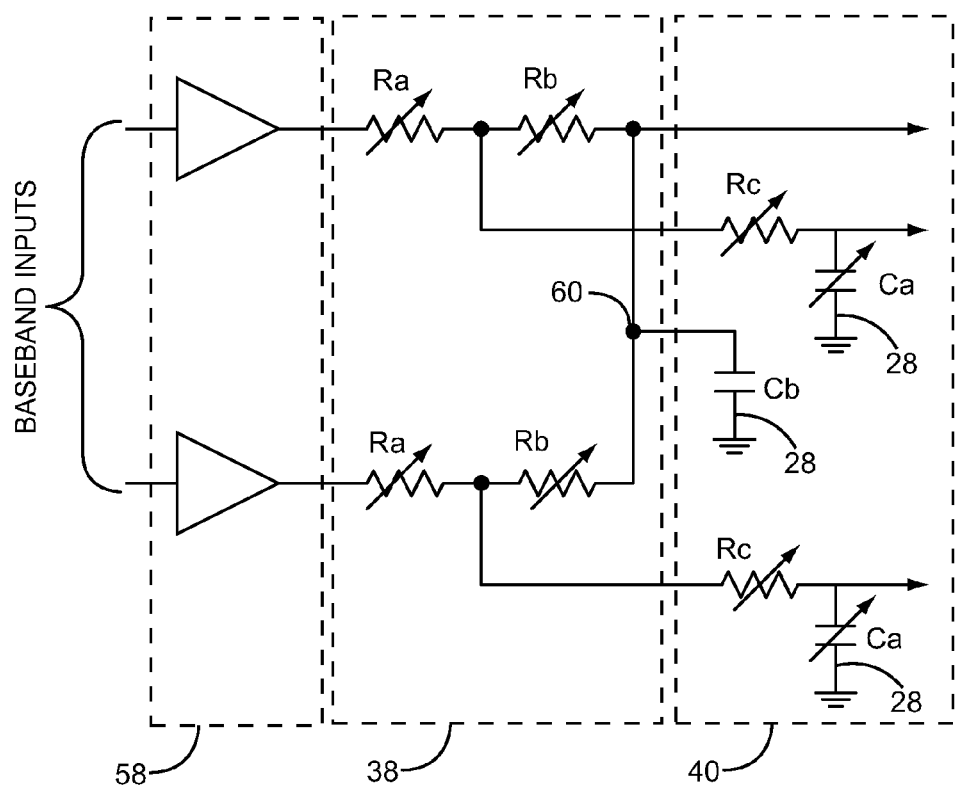
FIG. 4 is a circuit schematic that provides details to the resistive digital step attenuator and embedded single pole low-pass filter that are shown as block functions in FIG. 1.

FIG. 4 provides details of the resistive digital step attenuator 38 and the single pole low-pass filter 40 that are shown as block functions in FIG. 1. FIG. 4 also includes an input buffer and level shift block 58 for the baseband inputs for the transconductor stage 10 (FIGS. 1 and 2). The input buffer and level shift block 58 is preferred because the transconductor stage 10 generally has a high input impedance.

Resistors Ra and Rb set the attenuation. A capacitor Ca and a resistor Rc in series with the parallel combination of the resistors Ra and Rb set the low-pass filter pole position. The values of Ra, Rb, Rc, and Ca are chosen such that the cut off frequency of the filter remains constant as a function of attenuation. A capacitor Cb has a first terminal coupled to a node 60 and a second terminal coupled to the ground node 28 to provide noise filtering for the resistive digital attenuator 38.

$$Atten(dB) = 20 \times \log_{10}\left(\frac{Rb}{Ra+Rb}\right)$$

$$CutOfFrequency = \frac{1}{2\pi\left(Ca \times \left(Rc + Rswitch + \left(\frac{Ra \times Rb}{Ra+Rb}\right)\right)\right)}$$

Figure 5:
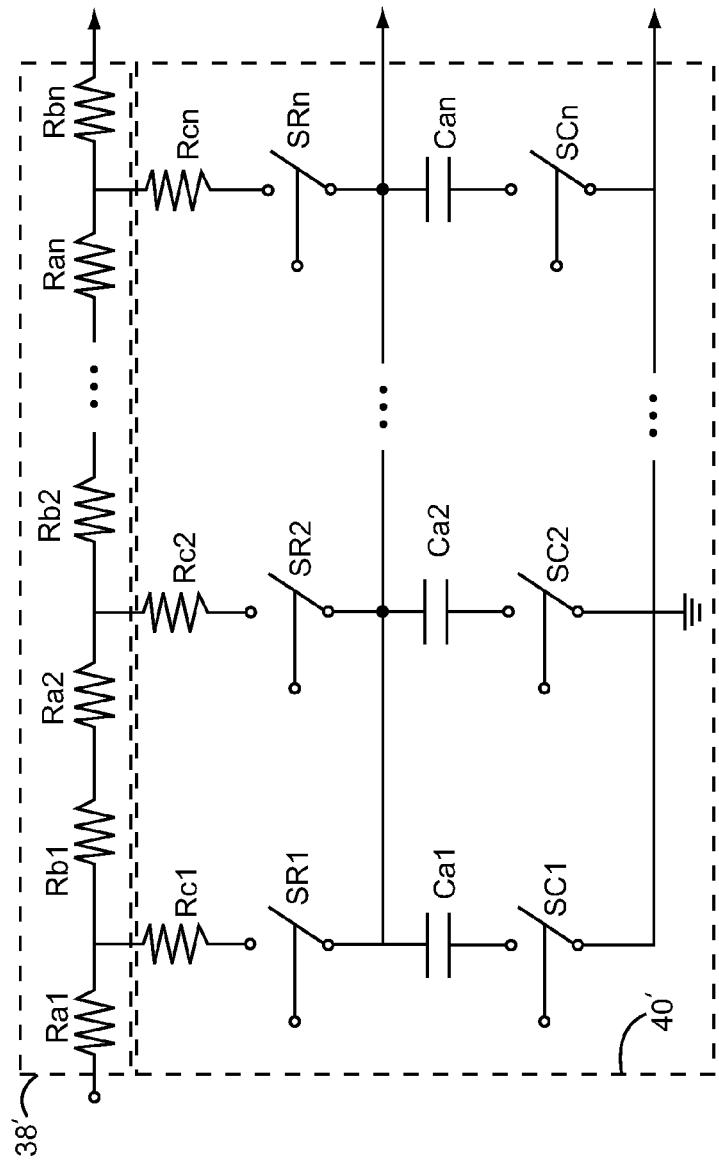
FIG. 5 is a circuit diagram of one branch of the resistive digital step attenuator and embedded single pole low-pass filter shown in FIG. 4.

FIG. 5 depicts either of the differential branches of the resistive digital step attenuator 38 denoted 38' and the single pole low-pass filter 40 denoted 40'. The variable resistors Ra and Rb are implemented as a string of series resistors Ra1 and Rb1, Ra2 and Rb2, and Ran and Rbn with a tap-off point for a desired attenuation setting. Thus, the attenuation is set by resistor matching of the summation of series resistors making up Ra and Rb and is not influenced by "on" resistance of any of a plurality of tap-off switches SR1, SR2, and SRn. The tap-off switches SR1, SR2, and SRn are preferably complementary metal oxide semiconductor (CMOS) switches.

Each tap point has its own dedicated resistor such as Rc1, Rc2, and Rcn that is placed in a series branch with the tap-off switches SR1, SR2, and SRn, respectively. Each tap point defines the attenuation setting. Adding the resistors Rc1, Rc2, and Rcn in series with the tap-off switches SR1, SR2, and SRn allows for the implementation of the single pole low-pass filter 40' that has a cut off frequency which does not change with the attenuation setting. The values of the resistors Rc1, Rc2, and Rcn are chosen such that the output impedance of the resistors Rc1, Rc2, and Rcn in series with each respective parallel combination of Rc1 and Rb1, Ra2 and Rb2, and Ran and Rbn is the same at all attenuation settings. The size of the tap-off switches SR1, SR2, and SRn, and hence each on resistance ($R_{on}$) of each of the tap-off switches SR1, SR2, and SRn is the same for all attenuation settings. The low frequency output impedance is constant as a function of attenuation. As such, a constant low-pass filter pole is created for the single pole low-pass filter 40'. Capacitors Ca1, Ca2, and Can are tunable to compensate for process variation and any bandwidth changes required due to telecommunication mode changes.

The transconductor stage 10 can be easily reconfigured to optimize the performance for a particular modulation scheme or frequency band. The linearity requirements and offset frequencies of critical noise specifications vary with the different bands and modulation modes.

Extra shunt capacitance can be switched in/out on the feedback loop's dominant pole and the single pole low-pass filter 40 (FIGS. 1 and 2) to give more noise filtering. When compared to the high WCDMA mode, the filter bandwidth should be reduced for Global System for Mobile Communications/Enhanced Data Rates for GSM Evolution (GSM/EDGE) applications in order to give more filtering at the critical 20 MHz offset. In Long Term Evolution (LTE) applications the filter bandwidths may be widened to accommodate the higher modulation bandwidths.

The quiescent DC bias current can be changed by adjusting the error amplifier's tail current. Increasing the quiescent current may be appropriate when using the transconductor stage 10 with signals that have a lower peak-to-average-ratio (PAR) for current.

Figure 6:
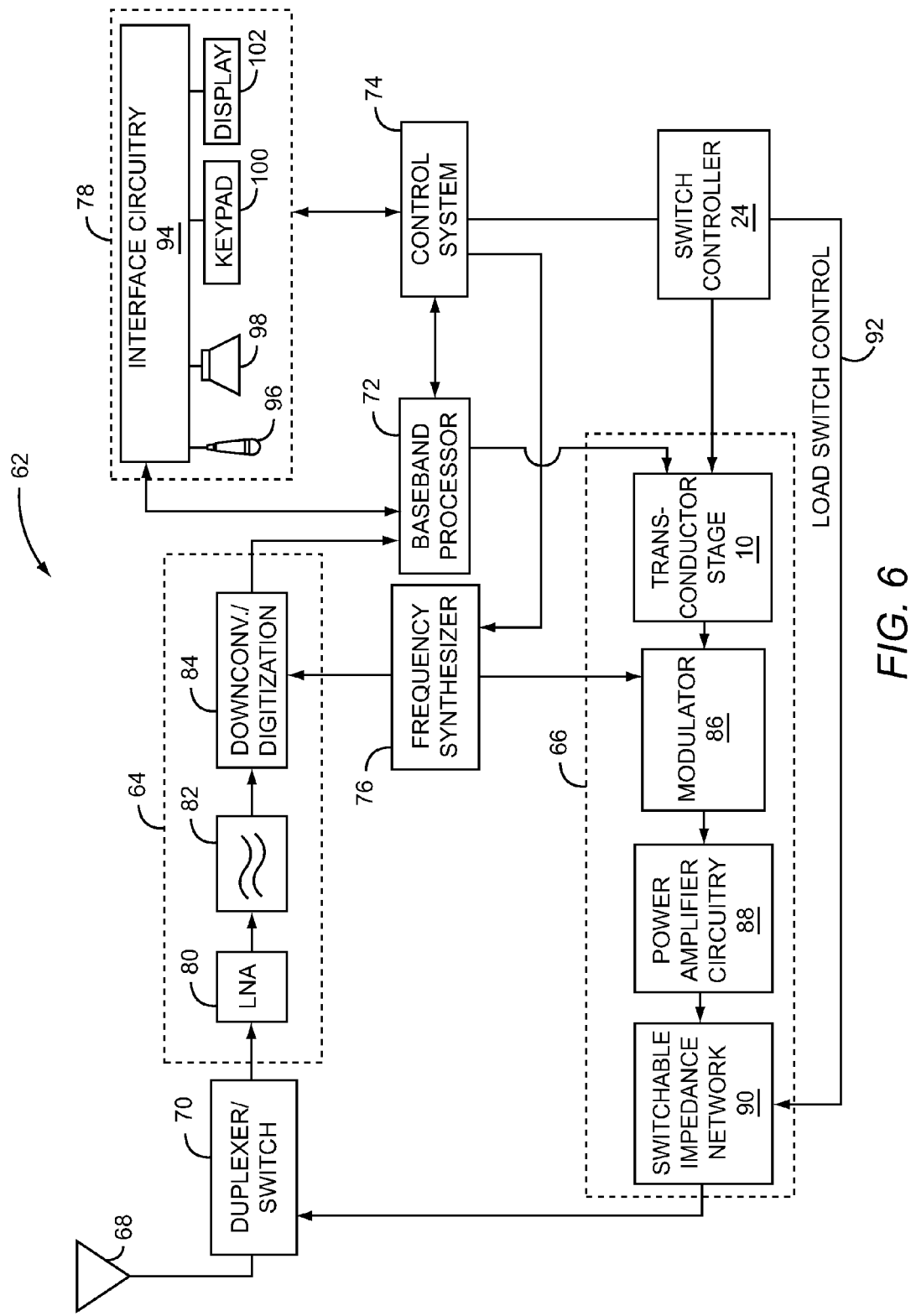
FIG. 6 is a block diagram of a mobile terminal that incorporates a transconductor stage according to the present disclosure.

Turning now to FIG. 6, a mobile terminal 62, such as a mobile telephone, a personal digital assistant, or the like incorporates the transconductor stage 10 in accordance with the present disclosure. The basic architecture of the mobile terminal 62 may include a receiver front end 64, a radio frequency transmitter section 66, an antenna 68, a duplexer or switch 70, a baseband processor 72, a control system 74, a frequency synthesizer 76, and an interface 78. The receiver front end 64 receives information bearing radio frequency signals from one or more remote transmitters provided by a base station. A low noise amplifier 80 amplifies the signal. A filter circuit 82 minimizes broadband interference in the received signal, while downconversion and digitization circuitry 84 downconverts the filtered received signal to an intermediate or baseband frequency signal, which is then digitized into one or more digital streams. The receiver front end 64 typically uses one or more mixing frequencies generated by the frequency synthesizer 76.

The baseband processor 72 processes the digitized received signal to extract the information or data bits conveyed in the received signal. This processing typically comprises demodulation, decoding, and error correction operations. As such, the baseband processor 72 is generally implemented in one or more digital signal processors (DSPs).

On the transmit side, the baseband processor 72 receives digitized data, which may represent voice, data, or control information, from the control system 74, and encodes the digitized data for transmission. The encoded data is output to the radio frequency transmitter section 66, where it is used by the transconductor stage 10 and a modulator 86 to modulate a carrier signal that is at a desired transmit frequency. Power amplifier (PA) circuitry 88 amplifies the modulated carrier signal to a level appropriate for transmission from the antenna 68.

The amplified signal is sent to the duplexer or switch 70 and the antenna 68 through a switchable impedance network 90, which is configured to set the overall load impedance for the PA circuitry 88 to optimize values based on the power level being transmitted. Typically, the duplexer or switch 70 and the antenna 68 provide a relatively constant load impedance, which is combined with the impedance of the switchable impedance network 90 to establish an overall load impedance for the PA circuitry 88. A load switch control signal 92 is provided by the control system 74 and the switch controller 24 to select an impedance matching network section, which will vary depending on the power level being transmitted.

A user may interact with the mobile terminal 62 via the interface 78, which may include interface circuitry 94 associated with a microphone 96, a speaker 98, a keypad 100, and a display 102. The interface circuitry 94 typically includes analog-to-digital converters, digital-to-analog converters, amplifiers, and the like. Additionally, it may include a voice encoder/decoder, in which case it may communicate directly with the baseband processor 72.

The microphone 96 will typically convert audio input, such as the user's voice, into an electrical signal, which is then digitized and passed directly or indirectly to the baseband processor 72. Audio information encoded in the received signal is recovered by the baseband processor 72, and converted into an analog signal suitable for driving speaker 98 by the input/output (I/O) and interface circuitry 94. The keypad 100 and the display 102 enable the user to interact with the mobile terminal 62, by inputting numbers to be dialed, address book information, or the like, as well as by monitoring call progress information.

Those skilled in the art will recognize improvements and modifications to the preferred embodiments of the present disclosure. All such improvements and modifications are considered within the scope of the concepts disclosed herein and the claims that follow.

What is claimed is:

1. A transconductor stage comprising:
    a master output stage having differential inputs, differential outputs, and feedback outputs, wherein the master output stage is biased for class AB amplifier operation;
    a feedback circuitry having differential inputs and differential outputs, wherein the differential inputs of the feedback circuitry are coupled to the feedback outputs of the master output stage;
    an error amplifier having baseband inputs, feedback inputs, and differential outputs, wherein the feedback inputs of the error amplifier are coupled to the differential outputs of the feedback circuitry; and
    a dominant pole low-pass filter having differential inputs and differential outputs, wherein the differential inputs of the dominant pole low-pass filter are coupled to the differential outputs of the error amplifier, and the differential outputs of the dominant pole low-pass filter are coupled to the differential inputs of the master output stage.

2. The transconductor stage of claim 1 further including at least one slave output stage coupled to the differential outputs of the master output stage, wherein the at least one slave output stage is biased for class AB amplifier operation.

3. The transconductor stage of claim 2 wherein the at least one slave output stage is adapted to drive an individual modulator core.

4. The transconductor stage of claim 3 wherein the individual modulator core is a Gilbert cell mixer core.

5. The transconductor stage of claim 2 further including at least one switch for the at least one slave output stage for enabling and disabling the at least one slave output stage.

6. The transconductor stage of claim 5 further including a switch controller for controlling a switch state of the at least one switch for the at least one slave output stage.

7. The transconductor stage of claim 2 wherein the master output stage and the at least one slave output stage comprise field effect transistors (FETs) that are biased with a constant common-mode gate-to-source voltage ($V_{gs}$).

8. The transconductor stage of claim 7 wherein the FETs substantially follow a square law characteristic when operated in a saturated region.

9. The transconductor stage of claim 7 wherein the error amplifier and the feedback circuitry provide just enough negative feedback that a predetermined adjacent channel leakage ratio (ACLR) requirement is just met.

10. The transconductor stage of claim 7 wherein a gain of the negative feedback is around 10 dB.

11. The transconductor stage of claim 7 wherein the dominant pole low-pass filter has a dominant pole of around 3 MHz.

12. The transconductor stage of claim 11 wherein the dominant pole low-pass filter has a closed loop bandwidth of around 10 MHz.

13. The transconductor stage of claim 1 further including a single pole low-pass filter having baseband inputs and baseband outputs wherein the baseband outputs of the single pole low-pass filter are coupled to the baseband inputs of the error amplifier.

14. The transconductor stage of claim 13 further including a resistive digital step attenuator having baseband inputs and baseband outputs, wherein the baseband outputs of the resistive digital step attenuator are coupled to the baseband inputs of the single pole low-pass filter.

15. The transconductor stage of claim 14 wherein a differential branch of the resistive digital step attenuator includes a plurality of series resistors with tap points between pairs of the plurality of series resistors, and wherein a first series branch including a first resistor and a first switch is coupled to each of the tap points between the pairs of the plurality of series resistors.

16. The transconductor stage of claim 15 further including a switchable shunt capacitor coupled to the tap points between the pairs of the plurality of series resistors of the differential branch of the resistive digital step attenuator.

17. A mobile terminal comprising:
a modulator to modulate a carrier signal; and
a transconductor stage for driving the modulator comprising:
- a master output stage having differential inputs, differential outputs, and feedback outputs, wherein the master output stage is biased for class AB amplifier operation;
- a feedback circuitry having differential inputs and differential outputs, wherein the differential inputs of the feedback circuitry are coupled to the feedback outputs of the master output stage;
- an error amplifier having baseband inputs, feedback inputs, and differential outputs, wherein the feedback inputs of the error amplifier are coupled to the differential outputs of the feedback circuitry; and
- a dominant pole low-pass filter having differential inputs and differential outputs, wherein the differential inputs of the dominant pole low-pass filter are coupled to the differential outputs of the error amplifier, and the differential outputs of the dominant pole low-pass filter are coupled to the differential inputs of the master output stage.

18. The mobile terminal of claim 17 further including at least one slave output stage coupled to the differential outputs of the master output stage, wherein the at least one slave output stage is biased for class AB amplifier operation.

19. The mobile terminal of claim 18 wherein the master output stage and the at least one slave output stage comprise FETs that are biased with a constant common-mode $V_{gs}$.

20. The mobile terminal of claim 19 wherein the FETs substantially follow a square law characteristic when operated in a saturated region.

* * * * *